US010262564B2

United States Patent
Lv

(10) Patent No.: US 10,262,564 B2
(45) Date of Patent: Apr. 16, 2019

(54) TEST CIRCUIT OF GATE DRIVER ON ARRAY AND TEST METHOD OF GATE DRIVER ON ARRAY

(71) Applicant: Shenzhen China Star Optoelectronics Semiconductor Display Technology Co., Ltd., Shenzhen, Guangdong (CN)

(72) Inventor: Xiaowen Lv, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 21 days.

(21) Appl. No.: 15/558,542

(22) PCT Filed: Aug. 21, 2017

(86) PCT No.: PCT/CN2017/098257
§ 371 (c)(1),
(2) Date: Sep. 14, 2017

(65) Prior Publication Data
US 2019/0019440 A1 Jan. 17, 2019

(51) Int. Cl.
*G01R 31/26* (2014.01)
*G09G 3/00* (2006.01)
*G09G 3/36* (2006.01)

(52) U.S. Cl.
CPC ........... *G09G 3/006* (2013.01); *G09G 3/3677* (2013.01); *G09G 2300/0434* (2013.01); *G09G 2330/12* (2013.01)

(58) Field of Classification Search
None
See application file for complete search history.

(56) References Cited

U.S. PATENT DOCUMENTS

| | | | | |
|---|---|---|---|---|
| 6,028,442 | A | 2/2000 | Lee et al. | |
| 7,307,686 | B2 | 12/2007 | Jang | |
| 7,423,447 | B2 * | 9/2008 | Yu | G01R 31/3181 324/760.01 |
| 7,808,267 | B2 | 10/2010 | Lee et al. | |
| 8,009,131 | B2 * | 8/2011 | Yu | G09G 3/006 345/87 |
| 8,125,605 | B2 | 2/2012 | Jeoung et al. | |
| 9,377,994 | B2 * | 6/2016 | Lin | G06F 5/08 |
| 2007/0115021 | A1 | 5/2007 | Tomita | |

FOREIGN PATENT DOCUMENTS

| | | | |
|---|---|---|---|
| CN | 102331633 | A | 1/2012 |
| CN | 102681224A | A | 9/2012 |
| CN | 105549289 | A | 5/2016 |
| CN | 106157858 | A | 11/2016 |
| CN | 106526918 | A | 3/2017 |
| CN | 106526918A | A | 3/2017 |
| KR | 20060042304 | A | 5/2006 |
| KR | 101433105 | B1 | 8/2014 |

* cited by examiner

*Primary Examiner* — Vinh P Nguyen
(74) *Attorney, Agent, or Firm* — Andrew C. Cheng

(57) ABSTRACT

The present invention provides a test circuit of gate driver on array (GOA) and a test method of GOA. The test circuit of GOA comprises a first wiring arranged outside the area where the plurality of display panels is located; a second wiring located between two of the adjacent regions; a switch unit arranged between the first wiring and the second wiring, wherein the area is divided into a plurality of areas where the display panel is located.

12 Claims, 2 Drawing Sheets

TEST CIRCUIT OF GATE DRIVER ON ARRAY AND TEST METHOD OF GATE DRIVER ON ARRAY

FIELD OF THE INVENTION

The present invention relates to a technology of liquid crystal display, and more particularly, to a test circuit of gate driver on array (GOA) and a test method of GOA.

DESCRIPTION OF PRIOR ART

A Liquid Crystal Display (LCD) based on GOA technology has the advantages of its uncomplicated process, low cost, and has gradually become the mainstream display device. In the manufacturing process, the LCD needs to set up the test circuit for an array test and a high vertical alignment (HVA) curing process.

In the current design of a circuit structure, referring to FIG. 1, the array test and the HVA curing process can share the peripheral wiring 11, and a wiring 12 is arranged between two of the display panel 10 in adjacent rows, the wiring 12 is not connected to the peripheral wiring 11. By applying driving signals to the wiring 12 or the peripheral wiring 11, each of the display panels 10 can receive array test signals only on one side of the display panel 10 by an array test pad 13, so that the unilateral drive of array test can be achieved. But in the HVA curing process, when applying driving signals to the peripheral wiring 11, each of the display panels 10 receives driving signals only on one side of the display panel 10 by a HVA curing process pad 14, so that the unilateral drive can of HVA curing process only be achieved. When the size of the display panel 10 is large or the size of the area where the plurality of display panels 10 is located is large, the attenuation of the drive signal transmission becomes serious due to be limited by line impedance and resistance capacitance, it will cause the display panel 10 appearing problems, such as split screen or screen gradient and other issues.

In order to avoid this problem, the industry has proposed the circuit structure shown in FIG. 2, to connect the ends of the wiring 12 and the peripheral wiring 11. When applying the drive signals to the peripheral wiring 11, both side of each display panel 10 can receive the drive signals, so as to achieve the bilateral drive of HVA curing process. However, the circuit structure design cannot achieve the unilateral drive of array test, when the drive circuit on one side of the display panel 10 does not work normally, pixels of the display panel 10 can still work under the control of the drive signals by the other side of the drive circuit, resulting in missed inspection.

SUMMARY OF THE INVENTION

In view of this, the present invention provides a test circuit of GOA and test method of GOA, both to achieve the unilateral drive of array test, but also to achieve the bilateral drive of HVA curing process.

A test circuit of GOA of the present invention, which is used for testing a plurality of display panels arranged in an array, wherein the test circuit of GOA on array comprises: a first wiring surrounds the area where the plurality of display panels is located, and is connected to an array test pad and a HVA curing pad of each of the display panels; at least one second wiring is parallel to the row direction, the area where the plurality of display panels is located, is divided by at least one second wiring into at least two regions arranged along the column direction, and each of the second wirings are located between two of the adjacent regions, each of the second wirings are connected to an array test pad and a HVA curing pad of each of the display panels located on both sides thereof; a thin film transistor is arranged between the first wiring and each of the second wirings for controlling to connect or disconnect the connection of the first wiring and each of the second wirings, wherein one of the thin film transistor is arranged between all of both ends of the second wirings and the first wirings, and a source and a drain of the thin film transistor are connected to the first wiring and the second wiring respectively; a third wiring is connected to a gate of the thin film transistor.

A test circuit of GOA of the present invention, which is used for testing a plurality of display panels arranged in an array, wherein the test circuit of GOA on array comprises: a first wiring is arranged outside the area where the plurality of display panels is located, and is connected to an array test pad and a HVA curing pad of each of the display panels; at least one second wiring is parallel to the first direction, the area where the plurality of display panels is located, is divided by at least one second wiring into at least two regions arranged along the column direction, wherein the second direction is perpendicular to the first direction, and each of the second wirings are located between two of the adjacent regions, each of the second wirings are connected to an array test pad and a HVA curing pad of each of the display panels located on both sides thereof; a switch unit is arranged between the first wiring and each of the second wirings for controlling to connect or disconnect the connection of the first wiring and each of the second wirings.

A test method of GOA of the present invention, which is used for testing a plurality of display panels arranged in an array, wherein the test circuit of GOA on array comprises: arranging a first wiring outside the area where the plurality of display panels is located, and the first wiring is connected to an array test pad and a HVA curing pad of each of the display panels; arranging at least one second wiring parallel to the first direction, the area where the plurality of display panels is located, is divided by at least one second wiring into at least two regions arranged along the column direction, wherein the second direction is perpendicular to the first direction, and each of the second wirings are located between two of the adjacent regions, each of the second wirings are connected to an array test pad and a HVA curing pad of each of the display panels located on both sides thereof; arranging a switch unit between the first wiring and each of the second wirings.

Wherein the switch unit disconnects the connection of the first wiring and the second wiring, and applies an array test signal to the first wiring and the second wiring, to perform an array test on the plurality of display panels.

Wherein the switch unit connects the connection of the first wiring and the second wiring, and applies a HVA curing process signal to the first wiring and the second wiring, to perform a HVA curing process on the plurality of display panels.

The present invention can be concluded with the following advantages, the present invention provides to arrange a first wiring outside the area where a plurality of display panels is located, and divided into at least two regions, arrange a second wiring between two of the adjacent regions, and arrange a switch unit between the first wiring and each of the second wiring. When disconnect the switch unit in performing an array test, it may apply array test signals only to one side of the display panel, so as to achieve the unilateral drive of array test, and further connect the switch unit in the HVA curing process, it may apply HVA curing process signals to both sides of the display panel, so as to achieve the bilateral drive of HVA curing process.

DESCRIPTION OF PREFERRED EMBODIMENT

Technical implementation will be described below clearly and fully by combining with drawings made in accordance with an embodiment in the present invention. In the case of non-collision, the following embodiments and the features in the embodiments may be combined with each other.

Figure 3:
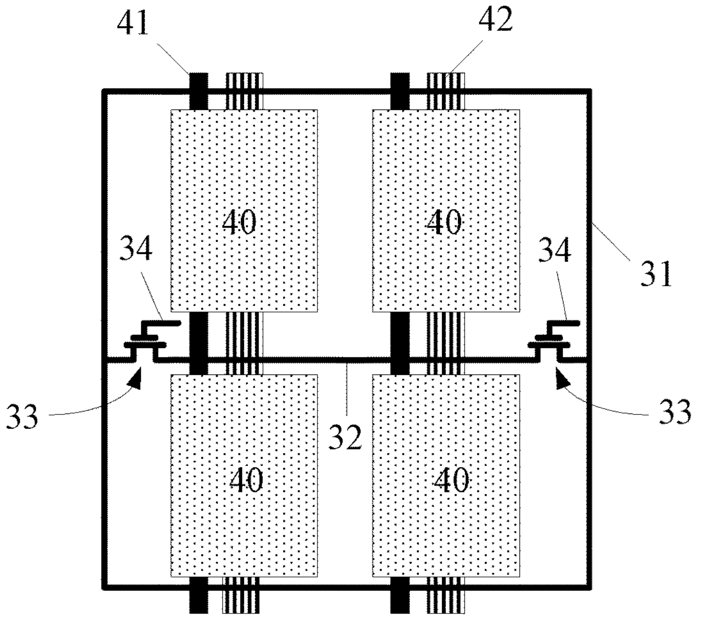
FIG. 3 is a structural illustration of a test circuit of GOA in accordance with an embodiment of the present invention.

FIG. 3 is a structural illustration of a test circuit of GOA in accordance with an embodiment of the present invention. Referring to FIG. 3, the test circuit of GOA comprises a first wiring 31, a second wiring 32, and a switch unit 33 arranged between the first wiring 31 and the second wiring 32.

The first wiring 31 is arranged outside the area where a plurality of display panels 40 is located. Specifically, the plurality of display panels 40 may be arranged in an array on a glass substrate, the first wiring 31 is a closed rectangular structure arranged on a glass substrate, and surrounds the area where the plurality of display panels 40 is located. The first wiring 31 of the present embodiment may be considered as a common peripheral wiring of the array test and the HVA curing process. Based on this, the first wiring 31 is connected to the array test pad 41 and the HVA curing pad 42 of each display panel 40.

The second wiring 32 is parallel to a first direction (i.e., the row direction,) which is arranged in the area where the plurality of display panels 40 is located. Specifically, the area where the plurality of display panels 40 is located, is divided into two regions along a second direction (i.e., the column direction) perpendicular to the first direction, the size of the two regions may be equal and the second wiring 32 is located between the two regions. Of course, it may set the first direction is the column direction and the second direction is the row direction in the present embodiment, in this case, the area where the plurality of display panels 40 is located, is divided into two regions along the row direction, and the second wiring 32 is parallel to the column direction. Further referring to FIG. 3, the second wiring 32 is connected to an array test pad 41 and a HVA curing pad 42 of each of the display panels 40 located on both sides thereof.

The switch unit 33 is arranged between the first wiring 31 and the second wiring 32 for controlling to connect or disconnect the connection of the first wiring 31 and the second wiring 32. Specifically, one of the switch unit 33 is arranged between all of both ends of the second wirings 32 and the first wirings 31, the switch unit 33 may be arranged outside the region where the plurality of display panels 40 is located, or between two of the adjacent regions. Also, in the embodiment of the present invention, the switch unit 33 may be a thin film transistor (TFT,) a source and a drain of the thin film transistor connected to the first wiring 31 and the second wiring 32 respectively. In order to control the connection and disconnection of the thin film transistor, a third wiring 34 of the present embodiment may be arranged between two of the adjacent regions. A gate of the thin film transistor is connected to the third wiring 34, and control signals are applied to the third wiring 34 to achieve the connection and disconnection of the thin film transistor. Wherein, the gates of the two thin film transistors connected to the same second wiring 32 may be connected to the same third wiring 34, and the third wiring 34 may be parallel to the second wiring 32, of course, the gate of the two thin film transistors connected to the same second wiring 32 may also be connected to a third wiring 34 respectively. It should be noticed that, the third wiring 34 of the present embodiment has no connection relationship with the array test pad 41 and the HVA curing pad 42 of the respective display panels 40.

When an array test is performed on the plurality of display panels 40, applying low-level signals to the third wiring 34 in the present embodiment, and the thin film transistor is disconnected, i.e., the switch unit 33 disconnects the connection of the first wiring 31 and the second wiring 32. Each display panel 40 may receive array test signals by setting an array test pad 41 on one of its side (upper side or lower side,) by applying the array test signals to the first wiring 31 or the second wiring 32, i.e., only one side of the display panel receives the array test signals, so as to achieve the unilateral drive of array test.

When an HVA curing process is performed on the plurality of display panels 40, applying high-level signals to the third wiring 34 in the present embodiment, and the thin film transistor is connected, i.e., the switch unit 33 connects the connection of the first wiring 31 and the second wiring 32. The first wiring 31 and the second wiring 32 form a closed loop circuit, each display panel 40 may receive HVA curing process signals by setting an HVA curing process pad 42 on its both sides (upper side and lower side,) by applying the HVA curing process signals to the first wiring 31 or the second wiring 32, i.e., both sides of the display panel receive the HVA curing process signals, so as to achieve the bilateral drive of HVA curing process.

In summary, the present embodiment can achieve the unilateral drive of array test, to avoid missing inspection caused by the bilateral drive of array tests, and the present embodiment can achieve the bilateral drive of HVA curing process, to avoid display panel 40 occurring problems such as split screen or screen gradient and other issues.

It should be noticed that, in other embodiments of the present invention, the area where the plurality of display panels 40 is located, may be divided into two or more regions, it is not limited to two regions described above as shown in FIG. 1. Relatively, the test circuit of GOA may include two or more second wirings 32, it is only necessary to arrange a switch unit at both ends of each second wiring 32, and controlling to connect or disconnect the connection of the first wiring 31 and each of the second wirings 32, so that the present invention can achieve the unilateral drive of array test and the bilateral drive of HVA curing process.

Figure 4:
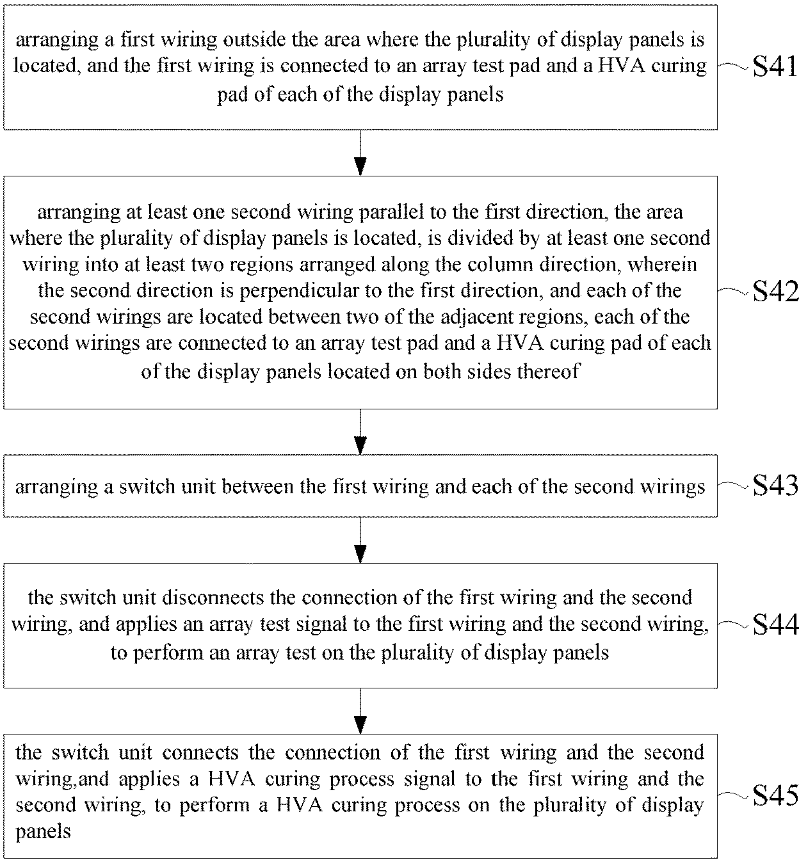
FIG. 4 is a flow chart of a test method of GOA in accordance with an embodiment of the present invention.

FIG. 4 is a flow chart of a test method of GOA in accordance with an embodiment of the present invention. Referring to FIG. 4, the test method of GOA of the present embodiment may comprises the following steps S41 to S45.

S41: arranging a first wiring outside the area where the plurality of display panels is located, and the first wiring is connected to an array test pad and a HVA curing pad of each of the display panels.

S42: arranging at least one second wiring parallel to the first direction, the area where the plurality of display panels is located, is divided by at least one second wiring into at least two regions arranged along the column direction, wherein the second direction is perpendicular to the first direction, and each of the second wirings are located between two of the adjacent regions, each of the second wirings are connected to an array test pad and a HVA curing pad of each of the display panels located on both sides thereof.

S43: arranging a switch unit between the first wiring and each of the second wirings.

S44: the switch unit disconnects the connection of the first wiring and the second wiring, and applies an array test signal to the first wiring and the second wiring, to perform an array test on the plurality of display panels.

S45: the switch unit connects the connection of the first wiring and the second wiring, and applies a HVA curing process signal to the first wiring and the second wiring, to perform a HVA curing process on the plurality of display panels.

Figure 1:
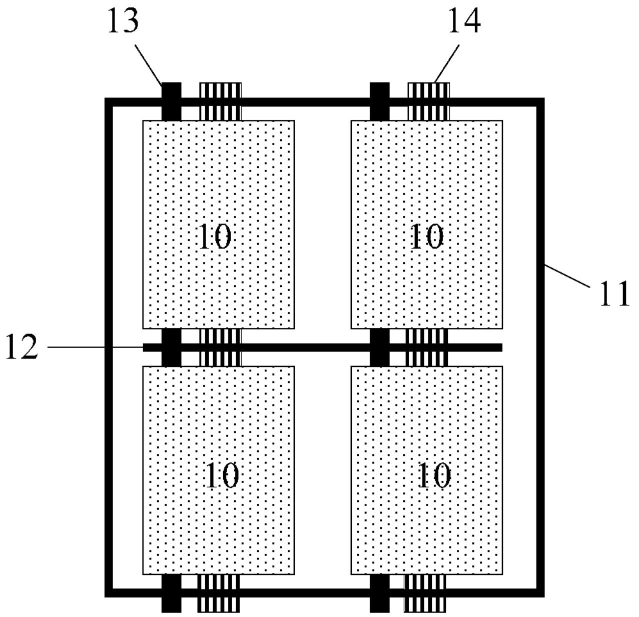
FIG. 1 is a structural illustration of a test circuit of GOA in accordance with an embodiment of the prior art.
Figure 2:
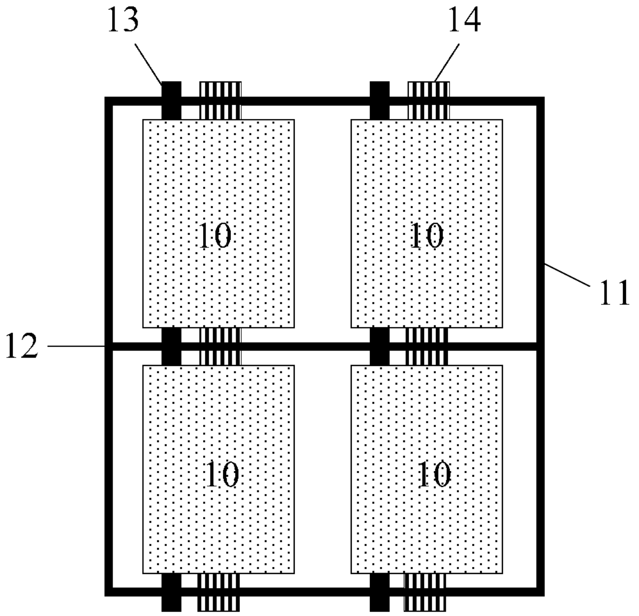
FIG. 2 is a structural illustration of a test circuit of GOA in accordance with another embodiment of the prior art.

Wherein, steps S41 to S43 may be regarded as forming the test circuit of GOA as shown in FIG. 1, steps S44 and S45 can be considered for performing an array test and a HVA curing process on the test circuit of GOA, respectively. The principles and procedures of the test method of GOA can be referred to the description of the embodiment as shown in FIG. 1, so that the test method of GOA has the same beneficial effect.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

The invention claimed is:

1. A test circuit of gate driver on array for testing a plurality of display panels arranged in an array, wherein the test circuit of gate driver on array comprises:

a first wiring surrounding the area where the plurality of display panels is located, and connected to an array test pad and a high vertical alignment curing pad of each of the display panels;

at least one second wiring parallel to the row direction, the area where the plurality of display panels is located, divided by at least one second wiring into at least two regions arranged along the column direction, and each of the second wirings located between two of the adjacent regions, each of the second wirings connected to an array test pad and a high vertical alignment curing pad of each of the display panels located on both sides thereof;

a thin film transistor arranged between the first wiring and each of the second wirings for controlling to connect or disconnect the connection of the first wiring and each of the second wirings, wherein one of the thin film transistor is arranged between all of both ends of the second wirings and the first wirings, and a source and a drain of the thin film transistor connected to the first wiring and the second wiring respectively;

a third wiring connected to a gate of the thin film transistor.

2. The test circuit of gate driver on array as recited in claim 1, wherein the thin film transistor is arranged outside the region where the plurality of display panels is located, or between two of the adjacent regions.

3. A test circuit of gate driver on array for testing a plurality of display panels arranged in an array, wherein the test circuit of gate driver on array comprises:

a first wiring surrounding the area where the plurality of display panels is located, and connected to an array test pad and a high vertical alignment curing pad of each of the display panels;

at least one second wiring parallel to the first direction, the area where the plurality of display panels is located, divided by at least one second wiring into at least two regions arranged along the column direction, wherein the second direction is perpendicular to the first direction, and each of the second wirings located between two of the adjacent regions, each of the second wirings connected to an array test pad and a high vertical alignment curing pad of each of the display panels located on both sides thereof;

a switch unit arranged between the first wiring and each of the second wirings for controlling to connect or disconnect the connection of the first wiring and each of the second wirings.

4. The test circuit of gate driver on array as recited in claim 3, wherein the switch unit comprises a thin film transistor, the test circuit of gate driver on array further comprising a third wiring between two of the adjacent regions;

a source, a drain, and a gate of the thin film transistor connected to the third wiring, the first wiring, and the second wiring respectively.

5. The test circuit of gate driver on array as recited in claim 4, wherein the thin film transistor is arranged outside the region where the plurality of display panels is located, or between two of the adjacent regions.

6. The test circuit of gate driver on array as recited in claim 3, wherein the first wiring surrounds the area where the plurality of display panels is located, and one of the switch unit is arranged between all of both ends of the second wirings and the first wirings.

7. The test circuit of gate driver on array as recited in claim 3, wherein one of the first direction and the second direction is a row direction and the other is a column direction.

8. A test method of gate driver on array for testing a plurality of display panels arranged in an array, wherein the test method of gate driver on array comprises:

arranging a first wiring outside the area where the plurality of display panels is located, and the first wiring connected to an array test pad and a high vertical alignment curing pad of each of the display panels;

arranging at least one second wiring parallel to the first direction, the area where the plurality of display panels is located, divided by at least one second wiring into at least two regions arranged along the column direction, wherein the second direction is perpendicular to the first direction, and each of the second wirings located between two of the adjacent regions, each of the second wirings connected to an array test pad and a high vertical alignment curing pad of each of the display panels located on both sides thereof;

arranging a switch unit between the first wiring and each of the second wirings;

wherein the switch unit disconnects the connection of the first wiring and the second wiring, and applies an array test signal to the first wiring and the second wiring, to perform an array test on the plurality of display panels;

and wherein the switch unit connects the connection of the first wiring and each of the second wiring, and applies a high vertical alignment curing process signal to the first wiring and the second wiring, to perform a high vertical alignment curing process on the plurality of display panels.

9. The test method of gate driver on array as recited in claim 8, wherein the switch unit comprises a thin film transistor, a source and a drain of the thin film transistor are connected to the first wiring and the second wiring respectively, the test method of gate driver on array further comprises:

arranging a third wiring between two of the adjacent regions, and the third wiring is connected to a gate of the thin film transistor;

wherein the switch unit disconnects the connection of the first wiring and the second wiring, which comprises:

applying a low-level signal to the third wiring;

and wherein the switch unit disconnects the connection of the first wiring and the second wiring, which comprises:

applying a high-level signal to the third wiring.

10. The test method of gate driver on array as recited in claim 9, wherein the thin film transistor is arranged outside the region where the plurality of display panels is located, or between two of the adjacent regions.

11. The test method of gate driver on array as recited in claim 8, wherein the first wiring surrounds the area where the plurality of display panels is located, and one of the switch unit is arranged between all of both ends of the second wirings and the first wirings.

12. The test method of gate driver on array as recited in claim 8, wherein one of the first direction and the second direction is a row direction and the other is a column direction.

* * * * *